United States Patent [19]
Watanabe

[11] Patent Number: 4,551,745
[45] Date of Patent: Nov. 5, 1985

[54] PACKAGE FOR SEMICONDUCTOR DEVICE
[75] Inventor: Hisashi Watanabe, Yokohama, Japan
[73] Assignee: Fujitsu Limited, Kawasaki, Japan
[21] Appl. No.: 425,650
[22] Filed: Sep. 28, 1982
[30] Foreign Application Priority Data
 Sep. 30, 1981 [JP] Japan ................. 56-153892
[51] Int. Cl.⁴ ............... H01L 23/04; B23K 11/34
[52] U.S. Cl. ................... 357/72; 228/173.3; 357/80
[58] Field of Search ............ 228/173 B; 219/83; 357/72, 74, 80

[56] References Cited
U.S. PATENT DOCUMENTS
1,249,532 12/1917 Smith et al. .............. 219/83
4,461,943 7/1984 Beauvis ................. 219/93

FOREIGN PATENT DOCUMENTS
155768 12/1979 Japan .................. 357/72
128680 10/1981 Japan .................. 219/83
48250 3/1982 Japan .................. 219/83

Primary Examiner—Kenneth J. Ramsey
Attorney, Agent, or Firm—Staas & Halsey

[57] ABSTRACT

A package for a semiconductor device including a sealing frame with first and second opposing sides, the second side having a projected edge portion comprising a flash or a burr produced by blanking presswork of the sealing frame. A package substrate is fixed to the first side of the sealing frame while a sealing cap is fixed to the second side of the sealing frame by seam welding. A semiconductor element is fixed to the package substrate. The sealing cap is seam welded to the sealing frame at the projected edge portion of the sealing frame and by doing so the contact resistance is increased so that reliable welding can be carried out and so that unnecessary heating of portions of the package other than the required welded portion can be prevented.

3 Claims, 6 Drawing Figures

PACKAGE FOR SEMICONDUCTOR DEVICE

BACKGROUND OF THE INVENTION

The present invention relates to a structure of a package for a semiconductor device. More particularly, it relates to a package for a semiconductor device wherein improved seam welding is carried out by welding the sealing cap and the projecting part of the sealing frame.

For the purpose of protecting a semiconductor element from mechanical impact and the atmosphere, a package made of, for example, alumina ceramic, is provided.

FIG. 1 is a perspective view of a conventional package, and FIG. 2 is a schematic cross-sectional view of the package of FIG. 1 taken along the line A—A, a cap 7 and electrodes 8,8′ being additional elements not shown in FIG. 1.

FIG. 3 is a partially enlarged schematic cross-sectional view illustrating a proposed package with seam welding of the sealing cap to the sealing frame, wherein the flashes 12 are not removed prior to fixing of the package substrate to sealing frame.

As shown in FIG. 1 and FIG. 2, a sealing frame 3 is provided on a surface of a package substrate 1 made of ceramic. In the inner side of the package substrate 1, a semiconductor element is fixed to the surface of the package substrate 1, and the semiconductor element is electrically connected to the outer lead 2 through leading wires 5 and inner conductive patterns 2′. After provision of the semiconductor element 4, the leading wires 5 and the inner conductive patterns 2′ are provided as mentioned above, and the sealing frame 3, which is made of, for example, KOVAR and which is preliminarily fixed to the package substrate 2 by silver soldering, etc., is sealed with the sealing cap 7 (FIG. 2) made of, for example, KOVAR, by welding. Conventionally, the process of welding the sealing cap 7 to the sealing frame 3 is by parallel seam welding wherein, as shown in FIG. 2, conical electrodes 8,8′ are rolled while contacting both edges of the sealing cap 7. Seam welding is carried out by using heat which is produced by flowing a current between electrodes 8 and 8′ at the contact portion of the sealing cap 7 and the sealing frame 3. The sealing frame 3, which is welded with the sealing cap 7, is usually obtained by blanking or presswork. As shown in FIG. 3, the sealing frame 3 produced by blanking or presswork has droops 11 and flashes 12, the shape of the flash 12 being a characteristic one produced by blanking or presswork.

Conventionally, in the seam welding of the sealing cap 7 to the sealing frame 3, the seam welding is carried out so that the side of the frame 3 having the droop portion 11 is welded to the sealing cap 7. Moreover, prior to seam welding of the sealing cap 7 to the sealing frame 3, it is conventional to remove the flashes 12 from the opposite side of the sealing frame 3 to ensure proper sealing between the sealing frame 3 and the package substrate 1.

In such seam welding, since the upper surface of the sealing frame 3 has the droop portion 11, a gap is made between the edges of the sealing frame 3 and the sealing cap 7. Further, in the conventional seam welding, the contact of the sealing frame 3 with the sealing cap 7 is an entire surface contact. Therefore, since the heating value per unit area is decreased, it is difficult to increase the temperature to the required temperature for the welding and, thus, the weldability of the sealing frame 3 to the sealing cap 7 is lowered. On the other hand, when the applied electric power is increased to improve the weldability, the package substrate 1 sometimes cracks due to the heat transmitted from the sealing frame 3.

During development of the invention and as shown in FIG. 3, it was proposed to weld the side of the sealing frame 3 having the droop portion 11 to the sealing cap 7 and fix the opposite side of the sealing frame 3 having gap 13 and flashes 12 produced by blanking or presswork to the package substrate 1 without removal of the flashes 12. However, a problem in the sealing effect between the sealing frame 3 and the package substrate 1 was found to occur in this proposed package.

SUMMARY OF THE INVENTION

Accordingly, it is an object of the present invention to provide a package for a semiconductor device which has improved airtight and sealing properties.

It is a further object of the present invention to provide a package for a semiconductor device wherein the weldability of the sealing cap to the sealing frame is improved.

The object of the present invention is achieved by a package for a semiconductor device comprising: a package substrate, a sealing frame fixed to the package substrate, a semiconductor element fixed to the package substrate, and a sealing cap which is fixed to the sealing frame by seam welding, the semiconductor element being sealed by the sealing frame and the sealing cap, and wherein a projected portion is formed on a side of the sealing frame to be welded to the sealing cap at the edge portion of the sealing frame side.

According to the present invention, by providing a projected portion on the sealing frame, the contact resistance is increased so that reliable welding can be carried out and so that unnecessary heating of a portion other than the required welded portion can be prevented.

Furthermore, when the sealing cap is seam welded to the sealing frame, the projected portion of the sealing frame prevents slippage of the sealing cap.

It is preferable that the projected portion of the sealing frame be flash or burr produced by blanking or presswork.

In addition, it is advantageous that the projected portion of the sealing frame contact the sealing cap lineally.

Furthermore, it is preferable that the vertical length of the projected portion project from the substantially horizontal surface of the sealing frame within the range of from 20 to 30 μm.

DETAILED DESCRIPTION OF THE PREFERRED EMBODIMENTS

Figure 4:
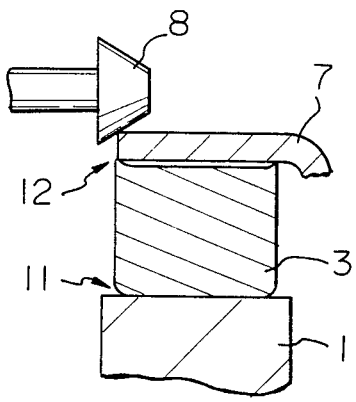
FIGS. 4 to 6 are partially enlarged schematic cross-sectional views illustrating different embodiments of a package for a semiconductor device according to the present invention.

Referring to FIG. 4, on the package substrate 1, the sealing frame 3 is provided.

The sealing frame 3 is produced by blanking or presswork. Therefore, the sealing frame 3 has flashes having for example, 25 μm lengths from the substantially horizontal surface thereof on one side of it and has droops on the other side of it. This is a frame produced by blanking or presswork.

In the sealing frame illustrated in FIG. 4, the frame side having droops 11 contacts the package substrate while the frame side having flashes 12 contacts the sealing cap 7. The seam welding is carried out by means of the electrodes 8 so that the edge portion of the sealing cap 7 is welded to the flash portion 12 of the frame having a curved surface which is produced substantially at the edge of the sealing frame 3. As a result, the contact of the curved surface of the flash portion of the sealing frame 3 with the edge portion of the sealing cap is changed to a line contact from a surface contact in the prior art.

Figure 1:
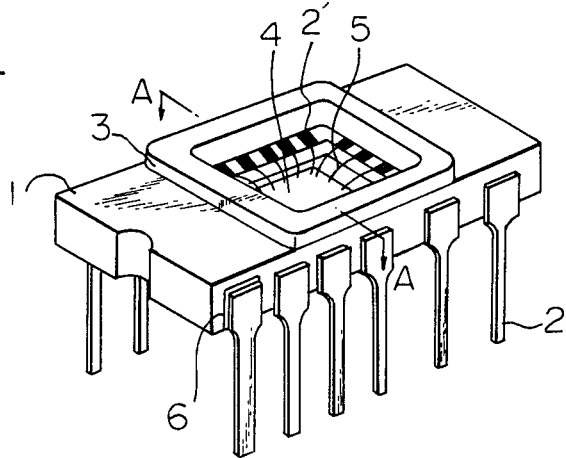
FIG. 1 is a perspective view of a conventional package.
Figure 2:
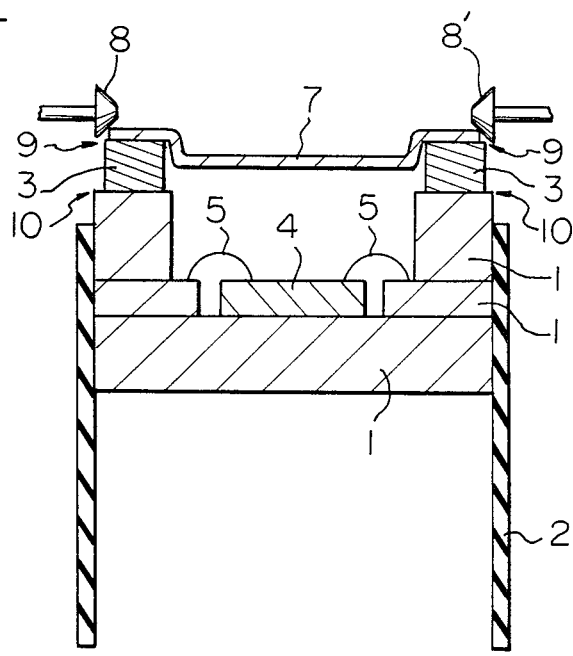
FIG. 2 is a schematic cross-sectional view of the package of FIG. 1 taken along the line A—A, a cap 7 and electrodes 8,8′ being additional elements not shown in FIG. 1.
Figure 3:
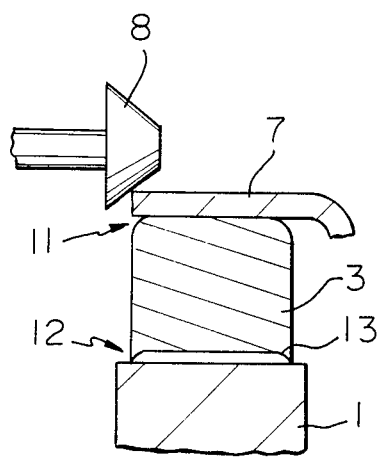
FIG. 3 is a partially enlarged schematic cross-sectional view illustrating a conventional package, such as in FIG. 2, with seam welding of the sealing cap to the sealing frame.

Thus, the heat value per unit area is increased and it is easy to increase the temperature up to the required temperature for the seam welding. Further, when the flash portion 12 of the frame is seam welded to the cap as shown in FIG. 4, the gap produced by the droops 11 shown in the package of FIG. 3 is not formed in the package structure shown in FIG. 4. Additionally, since a gap 13, illustrated in the package of FIG. 3, cannot be formed between the package substrate 1 and the sealing frame 3 in the package of FIG. 4, airtightness between the package substrate 1 and the sealing frame 3 can be improved. The package substrate is made of, for example, alumina ceramic.

Figure 5:
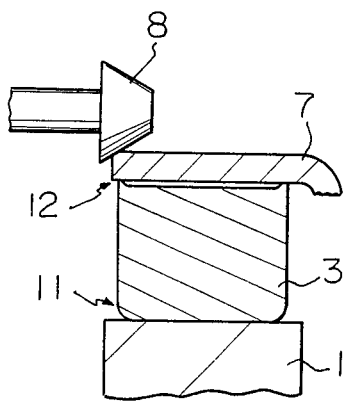

In the embodiment of FIG. 5, the sealing cap 7 completely covers the flash portion 12 of the sealing frame. When such a condition exists, seam welding can also be carried out and an improved package produced.

Figure 6:
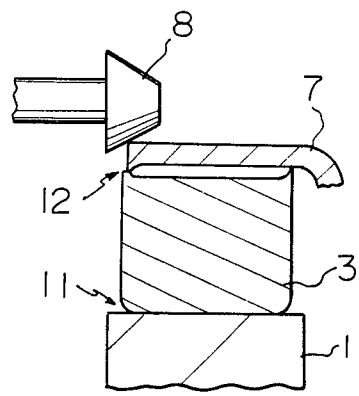

In addition to forming a projected portion of the sealing frame, it may be advantageous to form another projected portion of the sealing cap on the edge portion thereof, with the cap and frame to be welded as shown in FIG. 6. The projected portion of the sealing cap 7 may be a flash or a burr produced by presswork.

While what is considered to be the preferred embodiments of the present invention have been shown, it will be obvious that modifications may be made which come within the scope of this invention as disclosed herein.

I claim:

1. A package for a semiconductor device comprising: a sealing frame having first and second opposing sides, the second side having a projected edge portion comprising a flash or a burr produced by blanking presswork of said sealing frame; a package substrate fixed to said first side of said sealing frame; a semiconductor element fixed to said package substrate; and a sealing cap fixed to said second side of said sealing frame by seam welding, wherein said semiconductor element is sealed by said sealing frame and said sealing cap, and wherein said sealing cap is welded to said sealing frame at the projected edge portion of said sealing frame.

2. A package for a semiconductor device as claimed in claim 1, wherein said projected portion of said sealing frame contacts said sealing cap linearly.

3. A package for a semiconductor device as claimed in claim 1, wherein said sealing frame has a substantially horizontal surface facing the sealing cap and wherein said projected portion projects from the substantially horizontal surface of said sealing frame within the range of from 20 to 30 μm in length.

* * * * *